US006374385B1

United States Patent
Hämäläinen et al.

(10) Patent No.: US 6,374,385 B1
(45) Date of Patent: Apr. 16, 2002

(54) METHOD AND ARRANGEMENT FOR IMPLEMENTING CONVOLUTIONAL DECODING

(75) Inventors: Ari Hämäläinen, Vantaa; Jukka Henriksson, Espoo, both of (FI)

(73) Assignee: Nokia Mobile Phones Limited, Espoo (FI)

(*) Notice: Subject to any disclaimer, the term of this patent is extended or adjusted under 35 U.S.C. 154(b) by 0 days.

(21) Appl. No.: 09/318,247

(22) Filed: May 25, 1999

(30) Foreign Application Priority Data

May 26, 1998 (FI) .................................................. 981168

(51) Int. Cl.$^7$ ............................................. H03M 13/03
(52) U.S. Cl. ...................................................... 714/786
(58) Field of Search ............................. 706/43; 714/786

(56) References Cited

U.S. PATENT DOCUMENTS

| | | | | |
|---|---|---|---|---|
| 5,134,396 A | * | 7/1992 | Sirat et al. ...................... 341/51 |
| 5,166,938 A | * | 11/1992 | Chung ........................... 714/759 |
| 5,168,551 A | * | 12/1992 | Jeong ............................ 714/759 |
| 5,170,396 A | | 12/1992 | Rivers et al. ................... 371/6 |
| 5,177,746 A | * | 1/1993 | Chung ........................... 714/759 |

(List continued on next page.)

OTHER PUBLICATIONS

Teich et al. (W.G. Teich and J. Lindner, "A novel decoder structure for convolutional codes based on a multilayer perceptron", Proceedings IEEE International Conference on Neural Networks, 1995, vol: 1, pp.: 449–454).*

Cheolwoo et al. (Cheolwoo You and Daesik Hong, "Neural convolutional decoders in the satellite channel", Proceedings IEEE International Conference on Neural Networks, 1995, vol: 1, 1995, pp.: 443–448).*

Alston et al. (M.D. Alston and P.M. Chau, "A neural network architecture for the decoding of long constraint length convolutional codes", 1990 IJCNN International Joint Conference on Neural Networks, 1990, pp.: 121–126, vol. 1).*

Caid et al. (W.R. Caid and R.W. Means, "Neural network error correcting decoders for block and convolutional codes", Global Telecommunications Conference, 1990, and Exhibition. 'Communications: Connecting the Future', GLOCECOM '90., IEEE, 1990, p.: 1.*

Marcone et al. (G. Marcone, G. Orlandi and E. Zincolini, "An efficient neural decoder for convolutional codes", Relazione FUB: 1C01395 European Transactions on Telecommunications, vol. 6, No. 4, luglio–agosto 1995, pp. 439–445).*

Mason et al. (Kirk Mason and Dr. J. Sodha, "Neural Network Punctured Convolutional Code Decoder", 1997 ICSPAT, http://www.icspat.com/).*

/). Hamidian et al. (K. Hamidian, J. O. Tuazon, and P. Wang, "Neural Network Decoding Approach of Convolutional Code", 1996 ICSPAT, http://www.icspat.com/).*

(List continued on next page.)

Primary Examiner—Phung M. Chung
Assistant Examiner—Joseph D. Torres
(74) Attorney, Agent, or Firm—Perman & Green, LLP

(57) ABSTRACT

The invention relates to a method and an arrangement for decoding a convolutionally encoded signal which comprises code words and the arrangement comprises a neural network which comprises a set of neurons comprising a set of inputs and an output. The received code words are applied to the inputs of the neurons, and the arrangement combines some of the inputs of the neuron in the neuron. In order to enable efficient decoding of the convolutional encoding, some of the output signals of the neural network neurons are fed back to the inputs of the neuron and the neuron multiplies at least some of the inputs of the neuron with one another before combining. The output signal of a predetermined neuron comprises an estimate of a decoded symbol.

25 Claims, 8 Drawing Sheets

U.S. PATENT DOCUMENTS

| | | | |
|---|---|---|---|
| 5,268,684 A | | 12/1993 | Allen et al. .................... 341/75 |
| 5,293,453 A | * | 3/1994 | Frazier ......................... 706/17 |
| 5,327,439 A | | 7/1994 | Estola et al. ................... 371/43 |
| 5,396,653 A | | 3/1995 | Kivari et al. .................. 455/88 |
| 5,420,889 A | | 5/1995 | Juntti ......................... 375/346 |
| 5,430,740 A | | 7/1995 | Kivari et al. .............. 371/37.1 |
| 5,440,670 A | * | 8/1995 | Frazier ......................... 706/17 |
| 5,548,684 A | * | 8/1996 | Wang et al. ................... 706/16 |
| 5,632,006 A | * | 5/1997 | Peterson et al. .............. 706/38 |
| 5,784,392 A | | 7/1998 | Czaja et al. ............... 371/43.1 |
| 5,796,757 A | | 8/1998 | Czaja .......................... 371/46 |
| 6,151,594 A | * | 11/2000 | Wang .......................... 706/43 |

OTHER PUBLICATIONS

Bruck et al. (J. Bruck and M. Blaum, "Neural networks, error–correcting codes, and polynomials over cube", IEEE Transactions on Information Theory, vol.: 35 Issue: 5 Sep. 1989, pp.: 976–987).*

"Digital Communications", $3^{rd}$ edition, pp. 500–506, J.G. Proakis.

Patent Abstract of Japan JP 91 38787.

Finnish Official Action.

* cited by examiner

METHOD AND ARRANGEMENT FOR IMPLEMENTING CONVOLUTIONAL DECODING

FIELD OF THE INVENTION

The invention relates to a method and an arrangement for decoding in a receiver by a feedback neural network a signal that is convolutionally encoded in a transmitter.

BACKGROUND OF THE INVENTION

In telecommunications the signal path used for transmissions is known to cause interference of the communication. This occurs regardless of the physical form of the transmission path, i.e. whether the path is a radio link, an optical fiber or a copper cable.

In order to diminish the effects of interference caused by the transmission path, a digital signal is encoded so as to make the transmission connection more reliable. In that case interference-induced errors in the transmitted signal can be detected and, depending on the encoding method used, even corrected without retransmission. Conventional coding methods used in digital telecommunication include, for example, block coding and convolutional coding. In block coding the bits to be encoded are grouped into blocks and parity bits are added at the end of the blocks so that the correctness of the bits of the preceding block can be checked by means of the parity bits.

A typical coding method used in cellular radio applications is convolutional coding which is well suitable for a fading channel. In convolutional coding, the parity bits are placed among the data bits in such a way that the encoding is continuous. The data bits are not grouped into blocks nor are the parity bits connected to immediately preceding data bits, but they are distributed over the area of a bit group of a certain length, the number of bits being called the constraint length of a convolutional code.

Convolutional coding can be realized by a shift register. This is illustrated in FIG. 1. Generally described, the shift register consists of L k-bit stages 100 to 104 and n linear function generators 106 to 112. It is assumed here that the data to be encoded is binary. Data 114 is shifted into a shift register 116 k-bits at a time. The number of output 118 bits for each k-bit input sequence is n bits. The code rate is defined as $R_c = k/n$. The parameter L is called the constraint length of the convolutional code.

The efficiency of convolutional coding depends on the code rate and constraint length used. A large constraint length enables good error correcting capability, but, on the other hand, decoding is then extremely complicated by known methods.

Convolutional coding is typically decoded by using a Viterbi algorithm having nearly an optimal performance. It is a drawback of the Viterbi algorithm that its complexity increases exponentially as the constraint length increases. This has set limits to the constraint lengths available for use.

Another known decoding method is sequential decoding disclosed in more detail in publication by J. G. Proakis, Digital Communications, $3^{rd}$ edition, pp. 500–503. One of the drawbacks of this algorithm is that the decoding delay does not stay constant but varies.

Yet another known decoding method is what is known as a stack algorithm, disclosed in more detail in the above publication by J. G. Proakis, Digital Communications, $3^{rd}$ edition, pp. 503–506. The performance of this algorithm is not as good as that of the Viterbi algorithm.

U.S. Pat. No. 5,548,684 discloses a method applying neural networks in the decoding of a convolutional code. The method according to the publication implements the Viterbi algorithm by a neural network. However, the performance of the solution is not adequate enough for practical applications.

The known Viterbi algorithm method has the best performance for decoding convolutional coding, but its practical implementation turns out extremely complicated as the constraint length increases. A difficult hardware implementation of the complicated Viterbi algorithm has set limits to the constraint lengths available for use.

BRIEF DESCRIPTION OF THE INVENTION

An object of the invention is thus to provide a method and an arrangement implementing the method so as to solve the above problems. This is achieved by a method of the invention for decoding a convolutionally encoded signal which comprises code words and in which method decoding is carried out by an artificial neural network which comprises a set of neurons comprising a set of inputs and an output, and that the received set of code words is conducted to the inputs of the neuron by a shift register, and in which neuron, some of the inputs of the neuron are combined.

The method of the invention is characterized in that some of the output signals of the neural network neurons are fed back to the inputs of each neuron and at least some of the inputs of the neuron are multiplied with one another before they are combined and that initial values are set for the neurons and the network is allowed to settle into a state of equilibrium, an estimate of the decoded symbol is directed from the output signal of a predetermined neuron to the output of the network after the network has reached the state of equilibrium, the set of code words residing in the shift register are updated, and the above four steps are repeated until the desired number of code words have been decoded.

The invention also relates to an arrangement for decoding a convolutionally encoded signal which comprises code words and which arrangement comprises a neural network which comprises a set of neurons comprising a set of inputs and an output, and the received code words are applied to the inputs of the neurons, and which arrangement comprises means for combining some of the inputs of the neuron in the neuron.

The arrangement of the invention is characterized in that some of the output signals of the neural network neurons are fed back to the inputs of the neuron and that the neuron comprises means for multiplying at least some of the inputs of the neuron with one another before the combining means and that the output signal of a predetermined neuron comprises an estimate of a decoded symbol.

The preferred embodiments of the invention are disclosed in the dependent claims.

In the solution of the invention, a convolutional code is decoded by a feedback neural network. The solution of the invention provides many advantages. The solution of the invention provides a performance nearly compatible with the Viterbi algorithm by means of dramatically simpler circuit implementation. In the solution of the invention, equally complicated circuit implementation provides a larger constraint length and thus better error correction than in connection with the Viterbi algorithm.

The neural network of the invention can be easily constructed by semiconductor technology, because apart from the couplings of the inputs, the structure of the neural network neurons is very much alike. Consequently, designing and implementing even a large network does not involve great amount of work. The solution can also be advantageously implemented as a VLSI circuit, and therefore it is fast.

BRIEF DESCRIPTION OF THE DRAWINGS

In the following, the invention will be described in more detail by means of preferred embodiments with reference to the accompanying drawings, in which.

DETAILED DESCRIPTION OF THE INVENTION

The solution of the invention can be applied in any digital data transmission system in which a signal to be transmitted is encoded by convolutional coding. Examples of possible systems include cellular radio systems, radio links, fixed networks or optical networks.

Figure 2:
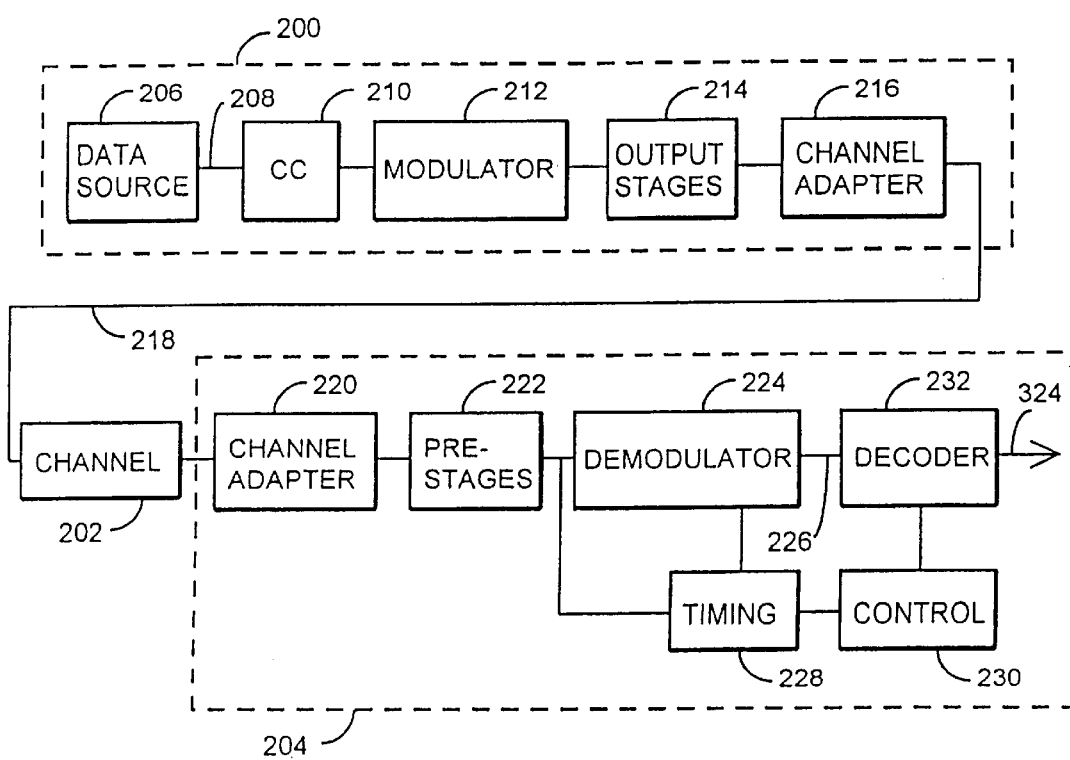
FIG. 2 illustrates an example of a telecommunication system in which the solution of the invention can be applied.

FIG. 2 illustrates an example of a telecommunication system of the invention. The figure shows a transmitter 200, a signal transmission path 202 and a receiver 204. The receiver implements the operations of the invention. The signal transmission path may be a radio path, a copper cable or an optical fiber, for example.

Figure 1:
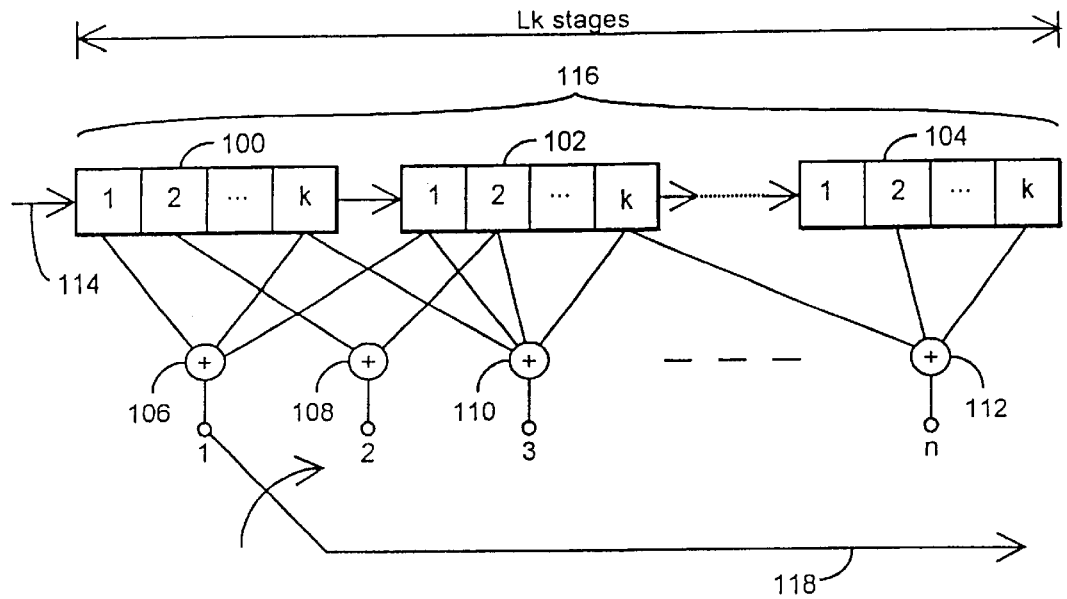
FIG. 1 shows the above-described example of a convolutional encoder.

In the transmitter, a data source 206 generates a signal 208 composed of bits. An error correcting code can be added to the signal 208 of the data source by a known forward error correcting (FEC) method, if necessary. This is not shown in the figure. The signal 208 is applied to an encoder 210 carrying out convolutional coding by the desired parameters (constraint length and code rate). The structure of the encoder may be similar to that shown in FIG. 1, for example. The encoded signal may be expressed as code words whose length depends on the code used. The encoded signal is applied to a modulator 212 carrying out the desired modulation. The modulated signal is applied further to output stages 214 and a channel adapter 216 of the transmitter, which are systemependent components. The output stage 214 may be a radio frequency amplifier and a filter, for example. The channel adapter 216 may be an antenna or an electricavoptoconverter, for example.

An output signal 218 of the transmitter propagates through the transmission path 202, i.e. a channel, to the receiver 204. The receiver comprises a channel adapter 220 and a receiver pre-stage 222, which are system-dependent components. The prestage 222 may comprise a radio frequency amplifier and a filter, for example. The channel adapter 220 may comprise an antenna or an opto/electrical converter, for example. The signal is applied from the pre-stage 222 further to a demodulator 224 from which a baseband bit stream 226, which may be complex and comprise separate I- and Q-branch bits, is typically received. Timing information is derived from the received signal in a regenerator 228 by a known method. This timing information is used in demodulation. The receiver further comprises a control unit 230 which can be advantageously implemented by a processor. The control unit 230 controls the operation of the receiver. Information on the timing is also applied to the control unit.

In other words, the signal 226 coming from the demodulator 224 comprises the demodulated bits which can be presented as code words. The code words are applied to a decoder 232 which is implemented in the receiver of the invention by a neural network. Convolutional coding is decoded in the decoder and an output signal 324 of the decoder corresponds to the original signal 208. If an error correcting code was used in the transmitter, the error correcting code is decoded at this stage. This is not shown in the figure.

Let us next study the method of the invention for decoding a convolutional code. Generally, the aim of decoding is to find a bit sequence B which minimizes the function $$\min_B \sum_{s=0}^{T} \|r(t+sdt) - \gamma(B(t+sdt))\|^2 =: \min_B f(B) \tag{1}$$

where r (t+sdt) is a received code word at a time instant t+sdt, dt is a sampling interval, γ is an encoder function and B(t+sdt) is a vector with decoded bits as its components.

For the sake of clarity, r(s)=r(t+sdt) and B(s)=B(t+sdt) are used. Furthermore, instead of bit values 0 and 1, values −1 and 1 are used. In Formula (1)

$$B(s)=[b(s-L+1), \ldots, b(s)], b \in \{1-, 1\},$$

b(−L+1), ..., b(0) are fixed, L is the constraint length and T is the decoding delay. The encoder function γ corresponds to the generation matrix G of a convolutional encoder. On the transmission path, interference, such as noise, is generated in the signal. Let us indicate a noisy code word received at a time instant s by r(s). Let us assume that white Gaussian noise is involved.

Let us study here the generation of a neural network of the invention by way of example employing a convolutional code with code rate ½ and constraint length L=3. The generation matrix G for such a code is $$G = \begin{bmatrix} 1 & 0 & 1 \\ 1 & 1 & 1 \end{bmatrix}.$$

The encoder for the convolutional code with code rate ½ and constraint length I can be written as $$\gamma(B(s))=[\gamma_1(B(s)), \gamma_2(B(s))],$$

where $$\gamma_i(B(s)) = \prod_{i=1}^{L} b(s+1-i)^{S,ji}(-1)(-1)^{R,ji},$$

and $g_{j,i}$s are the elements of the G matrix. Now, as in this example L=3, the encoder is thus of the form $$\gamma(B(s))=[-b(s)b(s-2), b(s)b(s-1)b(s-2)]$$

and the received noisy code word is r(s)=[$r_1(s)$ $r_2(s)$)].

When a partial derivative with respect to b(k) is derived from Formula (1), we obtain $$\frac{\partial f(B)}{\partial b(k)} = r_1(k)b(k-2) - r_2(k)b(k-1)b(k-2) \quad (2)$$
$$- r_2(k+1)b(k+1)b(k-1) + r_1(k+2)b(k+2)$$
$$- r_2(k+2)b(k+1)b(k+2) + 5b(k).$$

When a gradient method is used, b(k) is updated as follows:

$$b(k) = b(k) - \alpha \frac{\partial f(B)}{\partial b(k)}. \quad (3)$$

Furthermore, by setting $\alpha$=⅕ and assuming that b(k) obtains the value −1 or 1, the following equivalence is true for all the values k=0, . . . , T $$b(k)=\text{sign}(-r_1(k)b(k-2)+r_2(k)b(k-1)b(k-2)+r_2(k+1)b(k+1)b(k-1)-r_1(k+2)b(k+2)+r_2(k+2)b(k+1)b(k+2)). \quad (4)$$

From the above, the following updating rule is obtained: one k at a time is selected and a corresponding bit is updated by using Formula (4) and this is repeated until no changes occur in the bits, i.e. the network is stabilized. It should be noted here that if k=T−1, or k=T, then b(T+1)=0 and b(T+2)=0 are set. In the actual implementation the operation may take place in parallel so that all the neurons k are updated simultaneously.

The iteration according to Formula (4) can be presented as an artificial neuron of the neural network. By setting $S_k$=b(k), where $S_k$ is the state of the $k^{th}$ neuron and $I_l$=r(I), where $I_l$=[$I_{l,1}$, $I_{l,2}$] are the external inputs coming to the neuron, the state of the $k^{th}$ neuron can be presented as:

$$S_k=f_\alpha(-I_{k,1}S_{k-2}+I_{k,2}S_{k-1}S_{k-2}+I_{k+1,2}S_{k+1}S_{k-1}-I_{k+2,1}S_{k+2}+I_{k+2,2}S_{k+1}S_{k+2}), \quad (5)$$

where $f_\alpha$ is an activation function, typically a sigmoidal function or a hard limiter. In Formula (4), the signum function $f_\alpha(x)=\text{sign}(x)$ is used.

Figure 3:
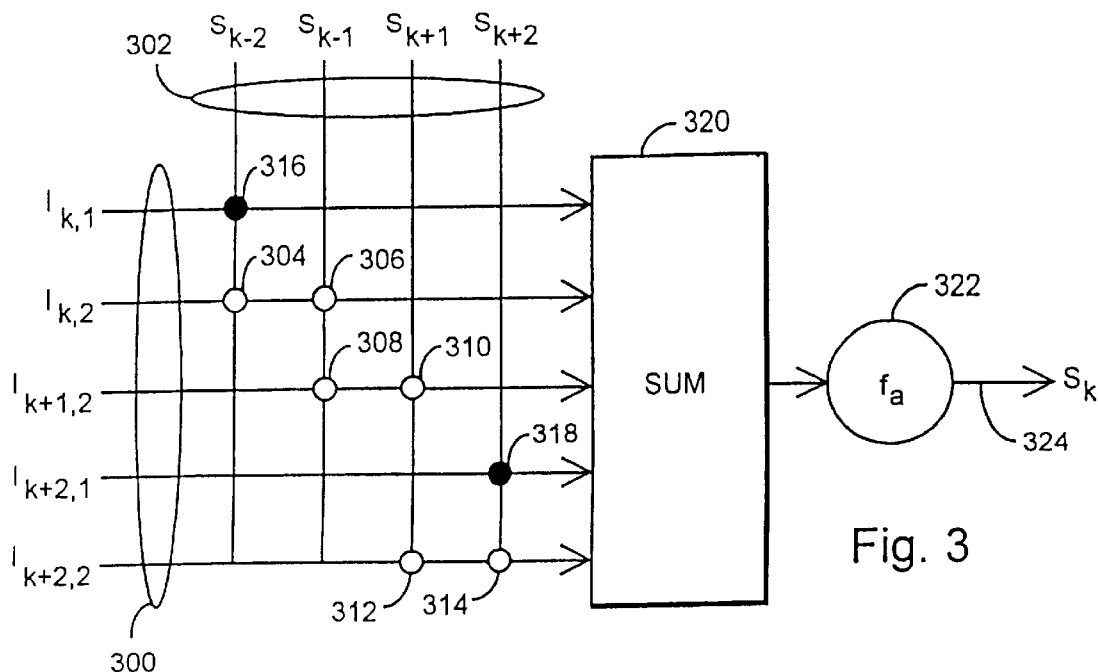
FIG. 3 shows an example of a neuron designed by the method of the invention.

FIG. 3 illustrates a neuron according to Formula (5). The state $S_k$ of the neuron appears at the output of the neuron. Code words to be decoded are applied to the neuron as an input 300, the code words being in this example composed of two bits. Since the code rate of the code used was ½, one bit to be encoded results in two bits when encoded. Correspondingly, in decoding, one decoded bit represents two bits of the code word. In accordance with Formula (5), bits $I_{k,1}$, $I_{k,2}$, $I_{k+1,2}$ and $I_{k+2,2}$ are applied to the neuron as an input, Furthermore, feedback outputs of the neurons of the other neural networks, i.e. $S_{k-2}$, $S_{k-1}$, $S_{k+1}$, and $S_{k+2}$, are applied to the neuron as an input 302. The output of each neuron thus comprises one decoded bit. In other words, the two bits $I_{k,1}$, $I_{k,2}$ of the code word to be decoded, the second bits $I_{k+1,2}$ and $I_{k+2,2}$ of the following code words and the output values of the two preceding and the two following neurons are applied in accordance with equation 5 to the neuron as an input.

In a preferred embodiment of the invention, the neuron is not fed back to itself, i.e. the value $S_k$ is not applied to the neuron as an input. The absence of this feedback in the above derivation of Formula (5) is caused by a coefficient $\alpha$ whose value ⅕ extracts the term 5b(k) from Formula (2). The inputs of the neuron are multiplied with one another in accordance with Formula (5). This is illustrated by dots at the intersection of lines. White dots 304 to 314 denote the multiplication of the inputs and black dots 316 to 318 denote the multiplication of the inputs and the change of the sign of the product. The multiplied signals are summed 320 and applied to an activation function 322 whose output $S_k$ 324 is the output value of the neuron.

In other words, the activation function can be either a function that generates a hard decision or a soft decision. If the result is a hard function, the outputs of the neuron may thus obtain the value −1 or 1. If the result is a soft decision, the output of the neuron may be a floating point number. Correspondingly, if the demodulator 224 generates soft bit decisions, the input 300 of the neuron comprises floating point numbers, and if the demodulator generates hard bit decisions, the input 300 of the neuron comprises bits. If both of the inputs of the neuron comprise bits, the multiplication between the inputs may be implemented in a simple manner by digital technology.

Since the derived neural network is what is called an optimizing neural network, it may be caught in a local minimum. In order to avoid this, noise, whose variance is reduced during stabilization, is added in a preferred embodiment of the invention to an incoming signal in neurons. In that case, Formula (5) is of the form $$S_k=f_\alpha(-I_{k,1}S_{k-2}+I_{k,2}S_{k-1}S_{k-2}+I_{k+1,2}S_{k+1}S_{k-1}-I_{k+2,1}S_{k+2}+I_{k+2,2}S_{k+1}S_{k+2}+\text{AWGN}). \quad (6)$$

In decoding, the following steps are generally carried out for each received code word:

1. Setting $S_{-1}$ and $S_{-2}$ according to previous decisions. The received code words r(t), . . . , r(t+Tdt) are set to inputs $I_0$, . . . , $I_T$.
2. Initializing S(i), i=0, . . . , T.
3. Updating neuron k according to Formula (6) for each k=0, . . . , T.
4. Reducing the variance of the added noise. If the required number of iteration rounds have been carried out, the procedure is terminated, otherwise the procedure returns to step 3. After this, the bit to be decoded is at the output of neuron 0.

Figure 4:
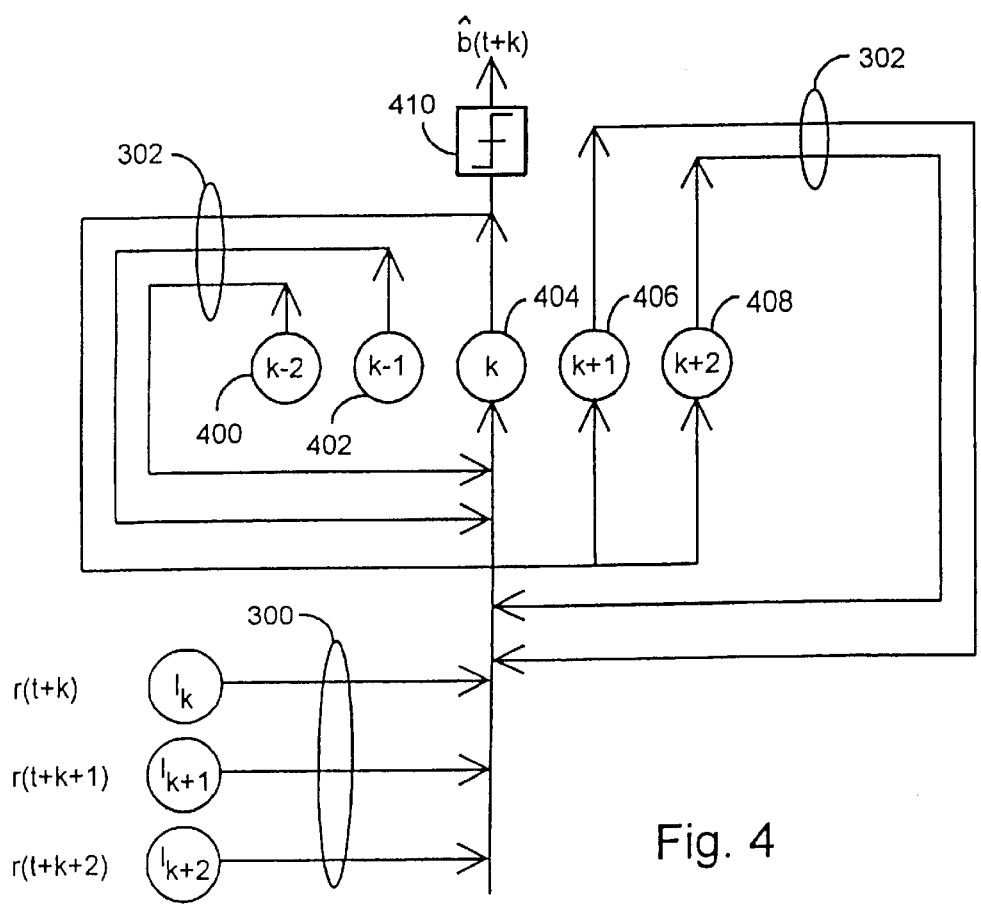
FIG. 4 shows an example of the couplings of a neuron in a neural network designed by the method of the invention.

FIG. 4 illustrates couplings associated with a single neuron k of a neural network which is designed for decoding code rate ½ and constraint length 3. Demodulated code words 300 and outputs of neurons 400, 402, 406 and 408 are applied to the single neuron as an input. The output of the neuron is a value of an activation function 410, the value being a decoded symbol. The neural network is initialized in a manner such that the previously made bit decisions become the states of neurons −2 and −1. As the states of neurons, 0, . . . T, +1 or −1 is randomly set. Next, the network is allowed to stabilize. The decoded bit is the output of a neuron 404, i.e. neuron 0, or if more than one bit is decoded at a time, the outputs of neurons 0, . . . , N.

Stabilization time of the network can be determined either by allowing the iterations to continue until the bit at the output does not vary or by carrying out a predetermined number of iteration rounds.

The following formula can be derived in the above manner for a convolutional code with code rate ½ and constraint length L=9 in order to generate a neural network and neurons:

$$S_k=f_\alpha(-I_{k,1}S_{k-2}S_{k-3}S_{k-5}S_{k-6}S_{k-7}S_{k-8}-I_{k,2}S_{k-1}S_{k-3}S_{k-4}S_{k-7}S_{k-8}+$$
$$I_{k,3}S_{k-1}S_{k-2}S_{k-5}S_{k-8}-I_{k+1,2}S_{k+1}S_{k-2}S_{k-3}S_{k-6}S_{k-7}+$$
$$I_{k+1,3}S_{k+1}S_{k-1}S_{k-4}S_{k-7}+I_{k+2,1}S_{k+2}S_{k-1}S_{k-3}S_{k-4}S_{k-5}S_{k-6}+$$

$I_{k+2,3}S_{k+2}S_{k+1}S_{k-3}S_{k-6}+I_{k+3,1}S_{k+3}S_{k+1}S_{k-2}S_{k-3}S_{k-4}S_{k-5}-$ $I_{k+3,2}S_{k+3}S_{k+2}S_{k-1}S_{k-4}S_{k-5}-I_{k+4,2}S_{k+4}S_{k+3}S_{k+1}S_{k-3}S_{k-4}+$ $I_{k+5,1}S_{k+5}S_{k+3}S_{k+2}S_{k-1}S_{k-2}S_{k-3}+I_{k+5,3}S_{k+5}S_{k+4}S_{k+3}S_{k-3}+$ $I_{k+6,1}S_{k+6}S_{k+4}S_{k+3}S_{k+1}S_{k-1}S_{k-2}+I_{k+7,1}S_{k+7}S_{k+5}S_{k+4}S_{k+2}S_{k+1}S_{k-1}-$ $I_{k+7,2}S_{k+7}S_{k+6}S_{k+4}S_{k+3}S_{k-1}+I_{k+8,1}S_{k+8}S_{k+6}S_{k+5}S_{k+3}S_{k+2}S_{k-1}-$ $I_{k+8,2}S_{k+8}S_{k+7}S_{k+5}S_{k+4}S_{k-1}+I_{k+8,3}S_{k+8}S_{k+7}S_{k+6}S_{k+3}+AWGN.$ (7)

Figure 5:
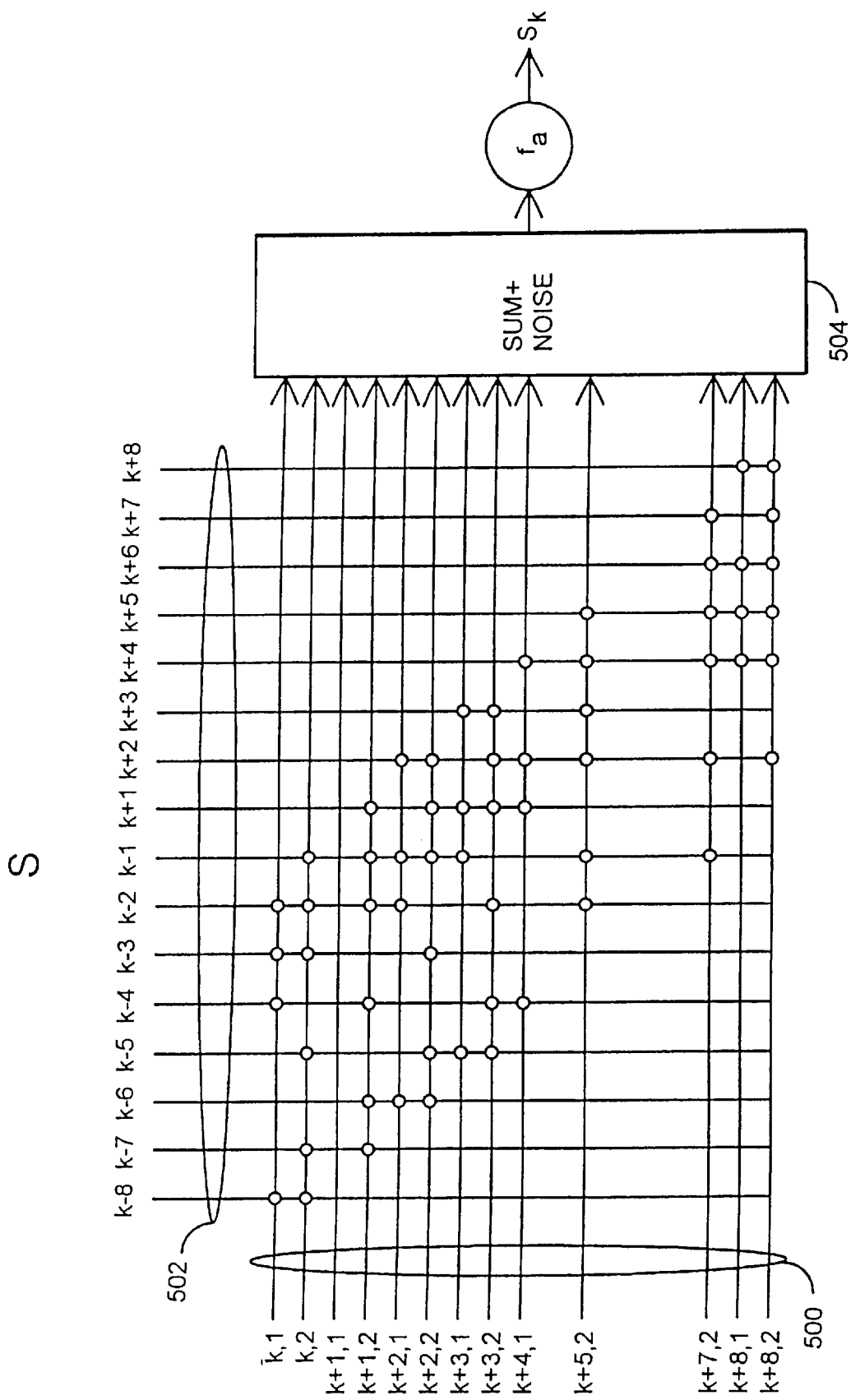
FIG. 5 shows a second example of a neuron designed by the method of the invention.
Figures 6, 6A:
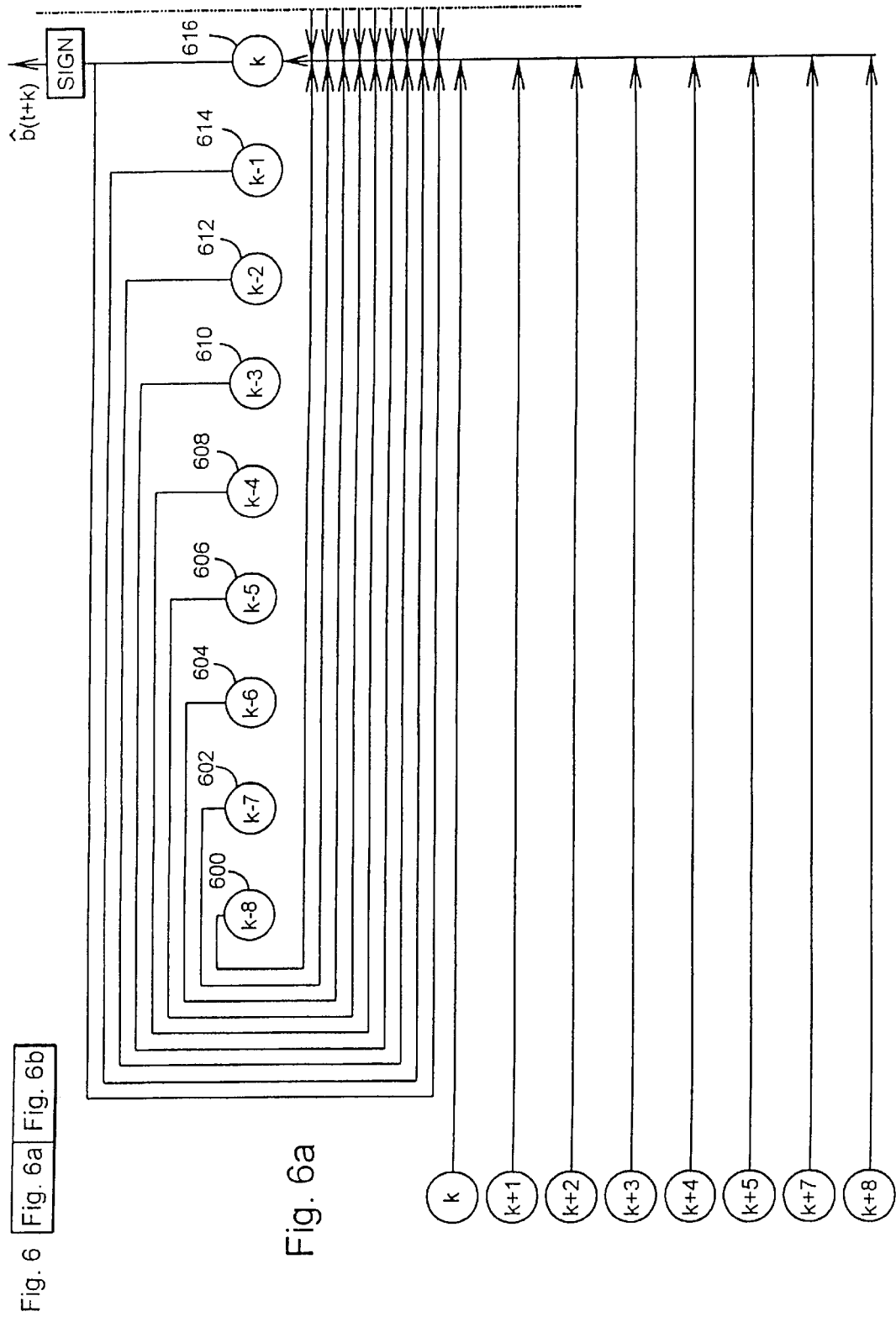
FIGS. 6a and 6b show a second example of the couplings of a neuron in a neural network designed by the method of the invention.
Figure 6B:
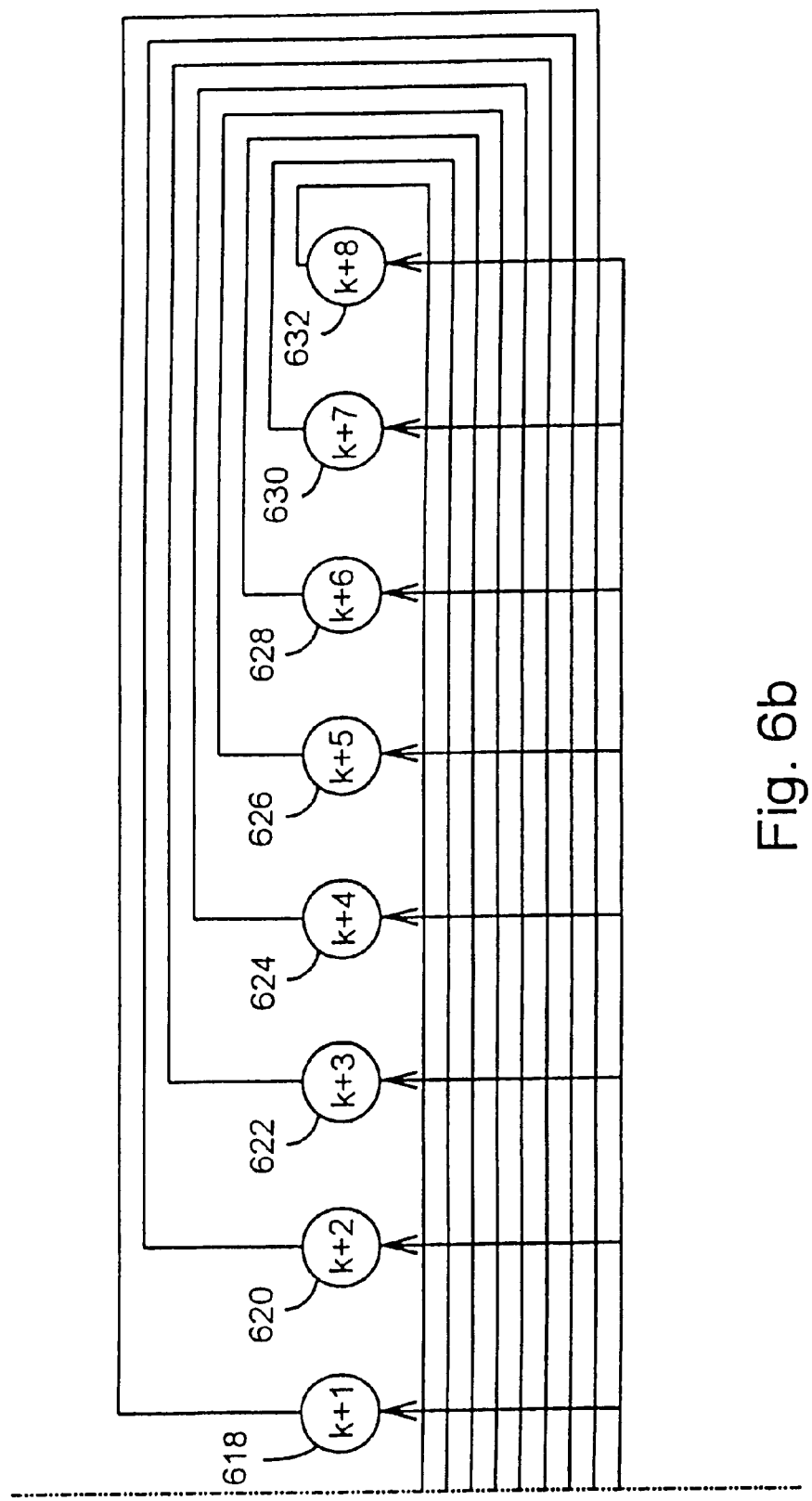

The structure of a neuron according to the above formula is illustrated in FIG. 5. Inputs 500 of the neuron comprise the received code words and inputs 502 comprise the feedbacks from the other neurons of the neural network. Multiplications of the inputs and changes of the signs take place according to Formula (7) and in summing 504 noise is added whose variance is reduced during stabilization. The couplings of a single neuron k of a corresponding neural network are illustrated in FIGS. 6a and 6b, in which each neuron 600 to 632 is similar to that presented in FIG. 5.

Besides, or instead of, the addition of noise, other methods can also be used so as to avoid being caught in a local minimum. The number of iteration rounds to be carried out can be increased. Another alternative is to use several parallel neural networks. When each neural network is stabilized, the best bit decision can be selected from the output of the networks. The selection can be carried out by majority decision, for example, selecting the bit decision which appears most frequently at the output of the parallel neural networks. The decoding result may also be re-decoded and the obtained result may be compared with the received code word, i.e. a solution may be selected which minimizes the function $$\frac{1}{T_b}\sum_{s=0}^{T_b}\|r(s)-r_{rc}(s)\|^2.$$ (8)

Decoding can also be accelerated in a manner such that several bit decisions of the adjacent neurons, i.e. neurons $S_0$, ... $S_N$ are simultaneously extracted from the neural network. When the following bits are decoded, the states of neurons $S_{-L+1}, \ldots, S_{-1}$ have to be initialized into the values obtained above.

The decoding method of the invention can also be applied when a code to be decoded is a punctured code.

Let us next study the complexity of the solution of the invention mainly from the point of view of implementation. When the constraint length L increases, more neurons are needed in the neural network, whereby stabilizing time increases and hence results in an increase in the number of multiplications, The complexity of a Viterbi decoder is known to increase exponentially as the constraint length L increases. However, an increase in the complexity of a decoder implemented by the neural network of the invention is considerably slower. When the constraint length is L, each neuron of the neural network is coupled to L–1 preceding and L–1 following neurons and L inputs. If it is assumed that the decoding delay is 5L, as it is often the case, the decoder requires 5L neurons and the number of connections is thus $(2(L-1)+Ln)(5L)=10L^2+5nL^2-10L,$ where n is the number of generators. In the above examples n=2. The number of multiplications to be performed in one neuron depends on the code generator used, but it is $\leq O(nL^2)$. The number of multiplications to be carried out during one iteration round, when each neuron is updated once, is $5LnL^2=O(nL^3)$. This shows how an increase in complexity in the solution of the invention is considerably slower than in connection with the Viterbi algorithm as L increases.

Figure 7A:
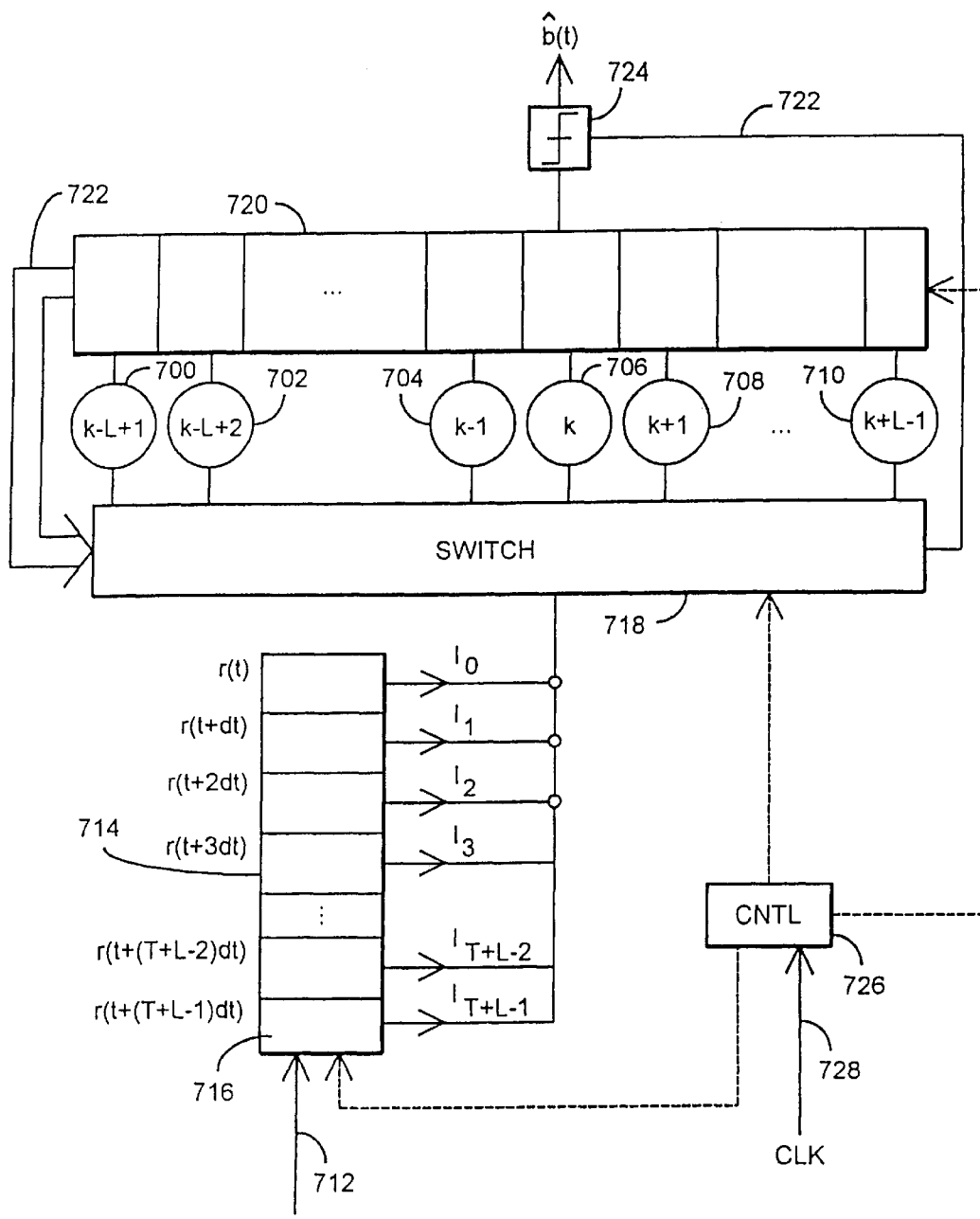
FIGS. 7a and 7b illustrate an example of an implementation of a neural network of the invention.

Let us next study the structure of a decoder of the invention from the point of view of implementation. The structure of a neural network of the invention is illustrated in FIG. 7a. The neural network comprises a set of neurons 700 to 710 whose implementation is examined later on. Code words 712 are applied to the neural network as an input and to a shift register 714. The shift register has the last T+L code words stored therein, where T denotes the decoding delay. Each time a code word has been decoded, the decoded code word is deleted from the register, the code words in the shift register are shifted forward by one and a new code word is included in a last memory location 716 of the register. The shift register is operationally connected to the inputs of the neurons 700 to 710 of the neural network. The neural network further comprises a buffer memory 720 having the outputs of the neurons 700 to 710 as an input and having its buffer memory output operationally connected to inputs 718 of the neurons of the neural network. The number of neurons depends on the properties of the convolutional code to be decoded.

The outputs of the neurons of the neural network are thus operationally connected to the buffer memory 720, from which the outputs are fed back 722 to the inputs 718 of the neurons. The input of the neurons comprises switching means 718 by means of which only the necessary code words and feedbacks are applied according to the derived formula (such as Formulas (6) and (7) presented above) to each neuron on the basis of the convolutional code to be decoded. The switching means 718 can be implemented by a switching matrix or discrete logic circuits. The bit to be each time decoded is derived from the output of a calculation means 724 which calculates the activation function. The calculation means 724 can be implemented by a discrete logic circuits or a processor.

A neural network decoder comprises a control unit 726. A clock signal 728 is applied to the control unit from the regenerator of the timing information of the receiver, as described in connection with FIG. 2. The control unit handles timing of the decoder, the control of the network stabilizing time and the control unit controls the decoding operation.

Figure 7B:
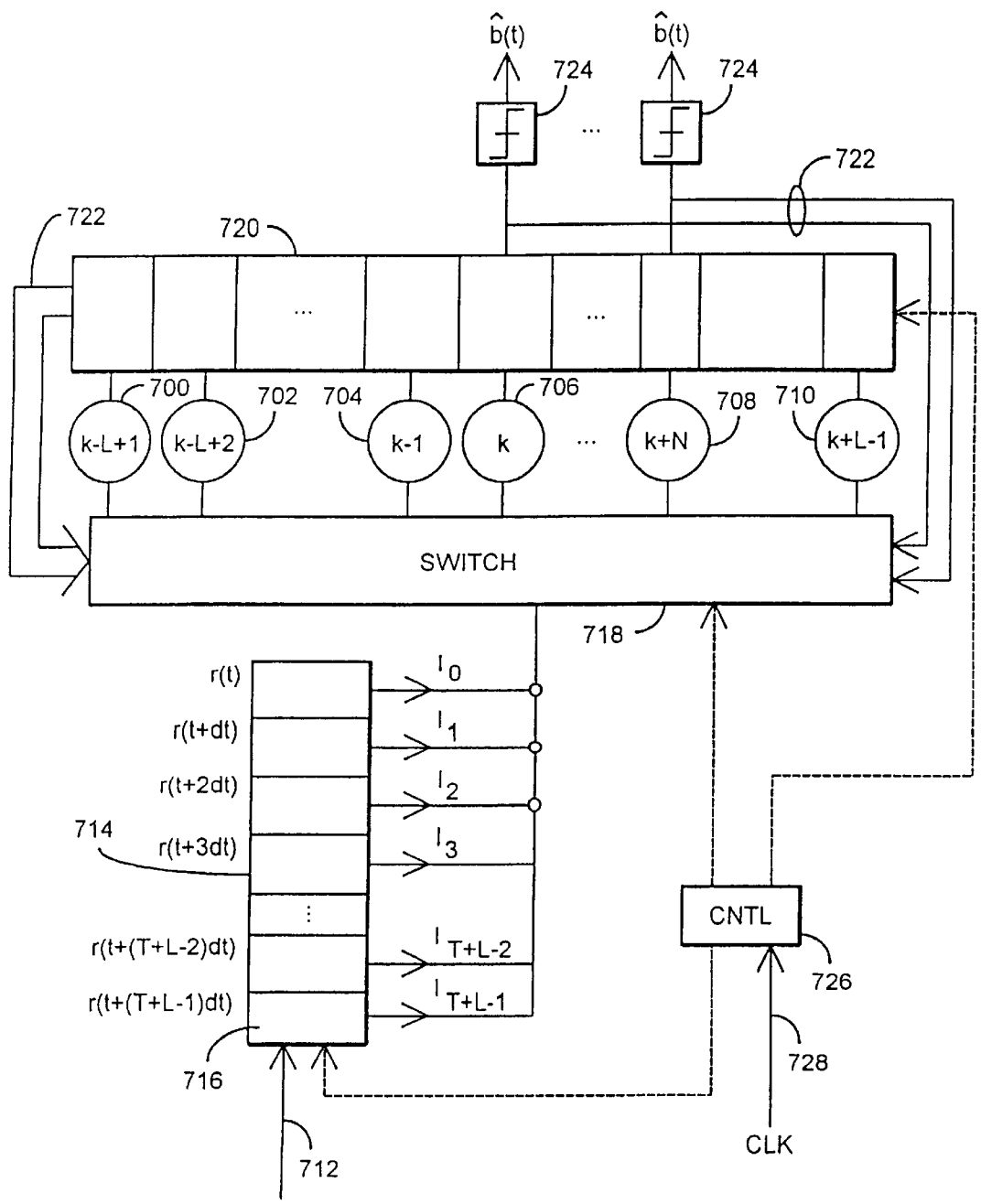

FIG. 7b illustrates another preferred embodiment in which several bit decisions are extracted simultaneously from adjacent neurons, i.e. neurons k . . . k+n, from the neural network. In that case, each time the code words have been decoded, n decoded code words are also deleted from the register, a corresponding n number of code words are shifted forward in the shift register 714 and n new code words are included in the register.

Figure 8:
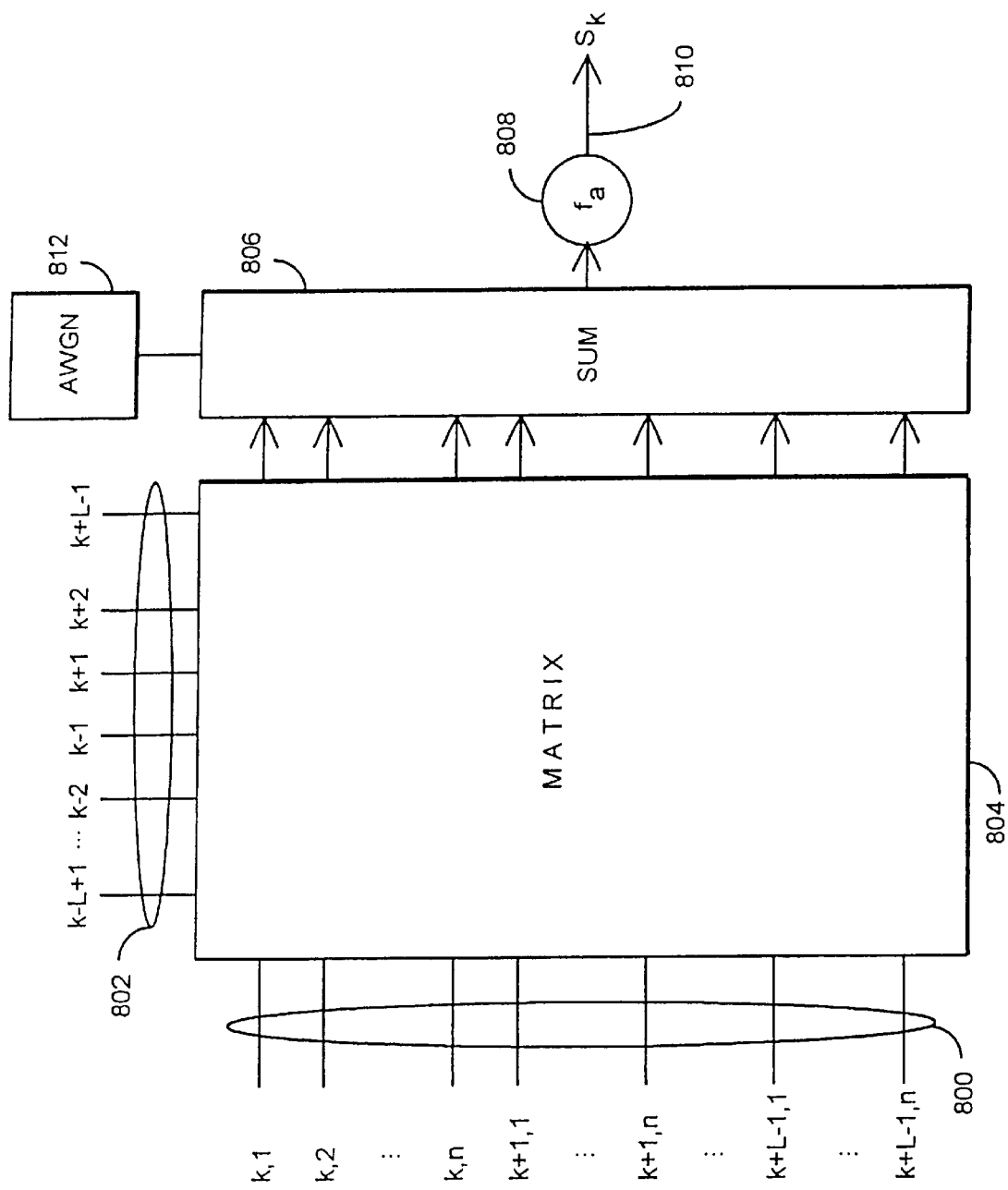
FIG. 8 illustrates an example of an implementation of a neuron in a neural network of the invention.

FIG. 8 illustrates the structure of a neuron of a neural network of the invention. The output of the neuron comprises the state $S_k$ of the neuron. The code words to be decoded are applied to the neuron as an input 800, the code words comprising bits. The number of bits in each code word depends on the code rate of the code used. Furthermore, feedback outputs of the other neurons of the neural network are applied to the neuron as an input 802. In a preferred embodiment of the invention the neuron is not fed back to itself, i.e. the value $S_k$ is not applied to the neuron as an input. However, feedback to itself is also possible if necessary.

The inputs of the neuron are multiplied with one another in a matrix 804. The couplings of the matrix are defined by the convolutional code used, and the formula corresponding to the coupling can be derived as illustrated in the above examples. The change of sign may or may not be involved in the multiplication of the inputs. The multiplied signals are applied to a summer 806 summing the signals. The summed signal is applied further to a calculation means 808 which calculates an activation function and whose output $S_k$ 810 is the output value of the neuron. The calculation means 724 can be implemented by a discrete logic circuits or a processor.

A function which generates either a hard decision or a soft decision can thus be used as an activation function. If the result is a hard decision, the outputs of the neuron may obtain the value −1 or 1. If the result is a soft decision, the output of the neuron may be a floating point number. Correspondingly, if the demodulator of the receiver generates soft bit decisions, the input 800 of the neuron comprises floating point numbers, and if the demodulator generates hard bit decisions, the input 800 of the neuron comprises bits. If both of the inputs of the neuron comprise bits, the multiplication between the inputs can be implemented in a simple manner by digital technology.

In a preferred embodiment of the invention, the neuron comprises a noise generator 812. Noise generated in the noise generator is applied to the summer 806 in which the noise is added to a sum signal. The variance of the noise to be generated is reduced during stabilization of the neural network, as described above. Gaussian noise or binary noise may be involved, of which binary noise is easier to implement, but a suitable number of Gaussian noise samples can however be stored in a memory element, and this noise can be reused. The generation of noise can be implemented in manners known to those skilled in the art.

The decoder of the invention can be constructed in a simple manner by semiconductor technology, because apart from the couplings of the inputs, the structure of the neural network neurons is very much alike. Consequently, designing and implementing even a large network does not involve great amount of work. Testing the complete circuit is also easy to implement. The solution can also be advantageously implemented as a VLSI circuit, and therefore it is fast. It should also be noted that although the structure of the decoder of the invention is simple and easy to implement, it has nearly a theoretically maximum performance.

Although the invention is described above with reference to the example according to the accompanying drawings, it is obvious that the invention is not restricted thereto, but it can be modified in many ways within the inventive idea disclosed in the attached claims.

What is claimed is:

1. An arrangement for decoding a convolutionally coded signal which comprises code words and which arrangement comprises a neural network which comprises a set of neurons comprising a set of inputs and an output, and the received code words are applied to the inputs of the neurons, and which arrangement comprises means for combining some of the inputs of an individual one of the neurons in the individual neuron, wherein some of the output signals of the neural network neurons, other than of the individual neuron, are fed back to the inputs of the individual neuron, and the individual neuron comprises means for multiplying at least some of the inputs of the individual neuron with one another before the combining means, and the output signal of a predetermined one of the neurons comprises an estimate of a decoded symbol.

2. An arrangement as claimed in claim 1, wherein the neuron comprises the means for multiplying at least some of the inputs of the neuron with one another and changing the sign of the product before the combining means.

3. An arrangement as claimed in claim 2, wherein the arrangement comprises a shift register with the received code words as an input, the shift register being operationally connected to the inputs of the neural network neurons, and a buffer memory with the outputs of the neurons as an input and a buffer memory output that is operationally connected to the inputs of the neural network neurons.

4. An arrangement as claimed in claim 3, wherein the arrangement comprises means for conducting the received set of code words to the shift register, setting initial values for the neurons and directing the estimate of the decoded symbol to the output of the network after the network has reached the state of equilibrium, updating the set of code words residing in the shift register, and repeating the above action until the desired number of code words have been decoded.

5. An arrangement as claimed in claim 2, wherein the neuron comprises means for adding noise to the outcome of the combining in the combining means.

6. An arrangement as claimed in claim 1, wherein the output signal of several predetermined neurons comprises an estimate of a corresponding number of decoded symbols.

7. An arrangement as claimed in claim 1, wherein the network is allowed to settle in the state of equilibrium for as long as the values of the output signals of the neurons no longer change.

8. An arrangement as claimed in claim 1, wherein after the inputs of the individual neuron have been combined, the signal is applied to an activation function and the output signal of the individual neuron is obtained from the output of the activation function.

9. An arrangement as claimed in claim 8, wherein the activation function makes a hard bit decision from the combined signal.

10. An arrangement as claimed in claim 8, wherein the activation function makes a soft bit decision from the combined signal.

11. A method of decoding a convolutionally encoded signal which comprises code words and in which method decoding is carried out by an artificial neural network which comprises a set of neurons comprising a set of inputs and an output, and that a received set of the code words is conducted to the inputs of the neurons by a shift register, and wherein in an individual one of the neurons, some of the inputs of the individual neuron are combined, the method comprising the steps of:

feeding back some of the output signals of the neural network neurons, other than of the individual neuron, to the inputs of the individual neuron, and multiplying at least some of the inputs of the individual neuron with one another before they are combined, setting initial values for the neurons and allowing the network to settle into a state of equilibrium, directing an estimate of the decoded symbol from the output signal of a predetermined neuron to the output of the network after the network has reached the state of equilibrium, updating the set of code words residing in the shift register, and repeating the above four steps until the desired number of code words has been decoded.

12. A method as claimed in claim 11, wherein at least some of the inputs of the neuron are multiplied with one another in the neuron and the sign of the product is changed before the combining.

13. A method as claimed in claim 12, wherein in connection with the combining of the inputs of the neuron, noise is added to the outcome of the combining.

14. A method as claimed in claim 13, wherein noise is added in such a way that the variance of the noise approaches zero as the network approaches a, state of equilibrium.

15. A method as claimed in claim 12, wherein the network is allowed to settle for a predetermined time until the values of the output signals no longer change.

16. A method as claimed in claim 12, wherein the multiplication of the inputs of the neuron depends on the convolutional code used in signal coding.

17. A method as claimed in claim 11, wherein the estimate of the decoded symbol is directed from the output signal of a predetermined neuron to the output of the network after the network has reached the state of equilibrium and the set of code words residing in the shift register is updated by the same predetermined number of code words.

18. A method as claimed in claim 11, wherein the signal to be decoded is a punctured signal.

19. A method as claimed in claim 11, wherein decoding is carried out by several parallel neural networks, and the best estimate is selected from the outputs of the parallel neural networks as the bit decoded.

20. A method as claimed in claim 19, wherein the value most frequently appearing at the outputs is selected from the outputs of the parallel neural networks as the bit decoded.

21. A method as claimed in claim 19, wherein the value that is found correct by re-encoding is selected from the outputs of the parallel neural networks as the bit decoded.

22. A method as claimed in claim 11, wherein when a convolutional code with code rate ½ and constraint length 3 is decoded, the inputs of the neural network neuron $S_k$, feedbacks and multiplications are constructed according to the formula $$S_k = f_\alpha(-I_{k,1}S_{k-2}+I_{k,2}S_{k-1}S_{k-2}+I_{k+1,2}S_{k+1}S_{k-1}-I_{k+2}S_{k+2}+I_{k+2,2}S_{k+1}S_{k-2}+\text{AWGN}).$$

where $f_\alpha$ is the desired activation function, $I_f$ represents the incoming code words and $S_i$ represents feedbacks from other neurons, and AWGN is noise whose variance reduces during the stabilization of the network.

23. A method as claimed in claim 11, wherein when a convolutional code with code rate ½ and constraint length 9 is decoded, the inputs of the neural network neuron $S_k$, feedbacks and multiplications are constructed according to the formula $$S_k = f_\alpha(-I_{k,1}S_{k-2}S_{k-3}S_{k-5}S_{k-6}S_{k-7}S_{k-8}-I_{k,2}S_{k-1}S_{k-3}S_{k-4}S_{k-7}S_{k-8}+$$

$$I_{k,3}S_{k-1}S_{k-2}S_{k-5}S_{k-8}-I_{k+1,2}S_{k+1}S_{k-2}S_{k-3}S_{k-6}S_{k-7}+$$

$$I_{k+1,3}S_{k+1}S_{k-1}S_{k-4}S_{k-7}+I_{k+2,1}S_{k+2}S_{k-1}S_{k-3}S_{k-4}S_{k-5}S_{k-6}+$$

$$I_{k+2,3}S_{k+2}S_{k+1}S_{k-3}S_{k-6}+I_{k+3,1}S_{k+3}S_{k+1}S_{k-2}S_{k-3}S_{k-4}S_{k-5}-$$

$$I_{k+3,2}S_{k+3}S_{k+2}S_{k-1}S_{k-4}S_{k-5}-I_{k+4,2}S_{k+4}S_{k+3}S_{k+1}S_{k-3}S_{k-4}+$$

$$I_{k+5,1}S_{k+5}S_{k+3}S_{k+2}S_{k-1}S_{k-2}S_{k-3}+I_{k+5,3}S_{k+5}S_{k+4}S_{k+3}S_{k-3}+$$

$$I_{k+6,1}S_{k+6}S_{k+4}S_{k+3}S_{k+1}S_{k-1}S_{k-2}+I_{k+7,1}S_{k+7}S_{k+5}S_{k+4}S_{k+2}S_{k+1}S_{k-1}-$$

$$I_{k+7,2}S_{k+7}S_{k+6}S_{k+4}S_{k+3}S_{k-1}+I_{k+8,1}S_{k+8}S_{k+6}S_{k+5}S_{k+3}S_{k+2}S_{k+1}-$$

$$I_{k+8,2}S_{k+8}S_{k+7}S_{k+5}S_{k+4}S_{k+1}+I_{k+8,3}S_{k+8}S_{k+7}S_{k+6}S_{k+3}+\text{AWGN}.$$

where $f_\alpha$ is the desired activation function, $I_f$ represents the incoming code words and $S_i$ represents feedbacks from other neurons, and AWGN is noise whose variance reduces during the stabilization of the network.

24. An arrangement for decoding a convolutionally coded signal which comprises code words and which arrangement comprises a neural network which comprises a set of neurons comprising a set of inputs and an output, and the received code words are applied to the inputs of the neurons, and which arrangement comprises means for combining some of the inputs of an individual one of the neurons in the individual neuron, wherein some of the output signals of the neural network neurons are fed back to the inputs of the individual neuron, and the individual neuron comprises means for multiplying at least some of the inputs of the individual neuron with another input selectively with positive and negative signs before the combining means, and the output signal of a predetermined one of the neurons comprises an estimate of a decoded symbol.

25. A method of decoding a convolutionally encoded signal which comprises code words and in which method decoding is carried out by an artificial neural network which comprises a set of neurons comprising a set of inputs and an output, and that a received set of the code words is conducted to the inputs of the neurons by a shift register, and wherein in an individual one of the neurons, some of the inputs of the individual neuron are combined, the method comprising the steps of:

feeding back some of the output signals of the neural network neurons to the inputs of the individual neuron, and multiplying at least some of the inputs of the individual neuron with another input selectively with positive and negative signs before the inputs are combined, setting initial values for the neurons and allowing the network to settle into a state of equilibrium, directing an estimate of the decoded symbol from the output signal of a predetermined neuron to the output of the network after the network has reached the state of equilibrium, updating the set of code words residing in the shift register, and repeating the above four steps until the desired number of code words has been decoded.

* * * * *